United States Patent
Kirshenbaum et al.

(10) Patent No.: US 10,289,341 B2
(45) Date of Patent: May 14, 2019

(54) OPERATING PARAMETER OFFSETS IN SOLID STATE MEMORY DEVICES

(71) Applicant: Western Digital Technologies, Inc., San Jose, CA (US)

(72) Inventors: Roi Kirshenbaum, Hod-Hasharon (IL); Karin Inbar, Ramat Hasharon (IL); Idan Goldenberg, Ramat Hasharon (IL); Nian Niles Yang, Mountain View, CA (US); Rami Rom, Zichron-Yaacov (IL); Alexander Bazarsky, Tel Aviv (IL); Ariel Navon, Revava (IL); Philip David Reusswig, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 65 days.

(21) Appl. No.: 15/640,356

(22) Filed: Jun. 30, 2017

(65) Prior Publication Data

US 2019/0004734 A1 Jan. 3, 2019

(51) Int. Cl.
*G06F 12/00* (2006.01)
*G06F 13/00* (2006.01)
(Continued)

(52) U.S. Cl.
CPC .......... *G06F 3/0659* (2013.01); *G06F 3/065* (2013.01); *G06F 3/0616* (2013.01);
(Continued)

(58) Field of Classification Search
CPC .................................................. G11C 16/30
See application file for complete search history.

(56) References Cited

U.S. PATENT DOCUMENTS 7,130,210 B2 * 10/2006 Bathul ................ G11C 11/5671
365/100
7,394,694 B2 7/2008 Micheloni et al.
(Continued)

OTHER PUBLICATIONS

International Search Report and Written Opinion dated Jun. 8, 2018 in International Application No. PCT/US2018/022474.
(Continued)

*Primary Examiner* — Sean D Rossiter
(74) *Attorney, Agent, or Firm* — Knobbe, Martens, Olson & Bear, LLP

(57) ABSTRACT

Systems and methods are described for generating location-based read voltage offsets in a data storage device. Optimal read voltage thresholds vary across memory elements of a device. However, data storage devices are often limited in the number of read voltage thresholds that can be maintained in the device. Thus, it may not be possible to maintain optimal read voltage parameters for each memory element within a device. The systems and methods described herein provide for increased accuracy of read voltage thresholds when applied to memory elements within a specific location in a device, by enabling the use of location-based read voltage offsets, depending on a relative location of the memory element being read from. The read voltage offsets can be determined based on application of a neural network to data regarding optimal read voltage thresholds determined from at least a sample of memory elements in a device.

22 Claims, 6 Drawing Sheets

(51) Int. Cl.
*G06F 3/06* (2006.01)
*G06N 3/08* (2006.01)

(52) U.S. Cl.
CPC .......... *G06F 3/0653* (2013.01); *G06F 3/0679* (2013.01); *G06N 3/08* (2013.01)

(56) References Cited

U.S. PATENT DOCUMENTS

| | | |
|---|---|---|
| 8,879,325 B1 | 11/2014 | Bar et al. |
| 9,058,890 B2 | 6/2015 | Kang |
| 9,104,591 B2 | 8/2015 | Tam |
| 9,122,626 B2 | 9/2015 | Kim et al. |
| 9,141,475 B2 | 9/2015 | Alrod et al. |
| 9,235,467 B2 | 1/2016 | Micheloni et al. |
| 9,368,225 B1 | 6/2016 | Pinkovich et al. |
| 9,397,701 B1 | 7/2016 | Micheloni et al. |
| 9,431,118 B1 | 8/2016 | Bar et al. |
| 9,448,868 B2 | 9/2016 | Liang |
| 9,536,601 B2 | 1/2017 | Chen et al. |
| 9,548,128 B2 | 1/2017 | Alhussien et al. |
| 9,607,692 B2 | 3/2017 | Tang et al. |
| 10,101,931 B1* | 10/2018 | Camp .................. G06F 3/0619 |
| 2008/0239820 A1* | 10/2008 | Wang ...................... G11C 8/08 365/185.17 |
| 2012/0176844 A1* | 7/2012 | Cunningham .......... G11C 11/14 365/185.22 |
| 2013/0294155 A1* | 11/2013 | Chen ................. G11C 16/0483 365/185.02 |
| 2014/0108891 A1* | 4/2014 | Strasser ............. G06F 12/0246 714/773 |
| 2014/0258590 A1 | 9/2014 | Kochar et al. |
| 2015/0085571 A1 | 3/2015 | Hu et al. |
| 2015/0117097 A1* | 4/2015 | Cai .................... G11C 16/3418 365/185.02 |
| 2016/0034206 A1 | 2/2016 | Ryan et al. |
| 2016/0147582 A1 | 5/2016 | Karakulak et al. |
| 2016/0170871 A1* | 6/2016 | Hyun ........................ G06F 3/06 711/103 |
| 2016/0225456 A1* | 8/2016 | Lin ........................ G11C 16/20 |
| 2017/0109040 A1 | 4/2017 | Raghu et al. |
| 2017/0337979 A1* | 11/2017 | Lee ........................ G11C 16/26 |
| 2018/0067697 A1 | 3/2018 | Lee et al. |
| 2018/0075916 A1* | 3/2018 | Lee .................... G11C 16/3454 |
| 2018/0137920 A1* | 5/2018 | Song ..................... G11C 16/12 |
| 2018/0261275 A1* | 9/2018 | Takizawa ............ G11C 11/4085 |

OTHER PUBLICATIONS

International Search Report and Written Opinion dated Jun. 18, 2018 in International Application No. PCT/US2018/022502.

Ojha et al., Metaheuristic Design of Feedforward Neural Networks: A Review of Two Decades of Research, Engineering Applications of Artificial Intelligence, Pineridge Press, Swansea, GB, vol. 60, Feb. 10, 2017, pp. 97-116.

Cai et al., Threshold Voltage Distribution in MLC NAND Flash Memory: Characterization, Analysis, and Modeling, DSSC, Department of Electrical and Computer Engineering, Carnegie Mellon University, 2013, 6 Pages, Pittsburgh, PA.

Cai et al., Neighbor-Cell Assisted Error Correction for MLC NAND Flash Memories, Jun. 16-20, 2014, 14 Pages, Sigmetrics'14, Austin, TX.

Lee and Sung, Estimation of NAND Flash Memory Threshold Voltage Distribution for Optimum Soft-Decision Error Correction, Jan. 15, 2013, vol. 61—Issue: 2, IEEE Transactions on Signal Processing.

* cited by examiner

| Set | TH1 | TH2 | TH3 | TH4 | TH5 | TH6 | TH7 |
|---|---|---|---|---|---|---|---|
| 1 | 0.49 | 1.35 | 2.05 | 2.8 | 3.55 | 4.4 | 5.1 |
| 2 | 0.48 | 1.37 | 2.15 | 2.85 | 3.65 | 4.42 | 5 |
| 3 | 0.47 | 1.45 | 2.25 | 2.75 | 3.7 | 4.44 | 5.2 |
| 4 | 0.45 | 1.3 | 2.18 | 2.88 | 3.45 | 4.46 | 5.3 |
| ... | | | | | | | |
| 48 | 0.33 | 1.12 | 2.02 | 2.72 | 3.38 | 4.35 | 4.87 |

*Fig. 3*

OPERATING PARAMETER OFFSETS IN SOLID STATE MEMORY DEVICES

BACKGROUND

Non-volatile memory, such as flash memory, have been widely adopted for use in consumer products. Flash memory may be found in different forms, for example in the form of a portable memory card that can be carried between host devices or as a solid state disk (SSD) embedded in a host device. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by comparing the cell read out voltage to one or more read voltage thresholds, each of which corresponds to a different state. These read voltage thresholds may vary between memory cells or groups of memory cells (e.g., blocks of cells). Thus, a device may be configured to store, for each memory cell or group of cells, a set of read voltage thresholds to be used for the particular memory cell or group of cells. Such voltage thresholds can form part of a set of operating parameters for the memory cell or group of cells. Various other operating parameters may also vary among cells or groups of cells, and be stored as operating parameters for the cell or group. To reduce the memory necessary to store operating parameters and reduce computing requirements necessary to apply operating parameters when reading from or writing to a cell or cell group, the device may limit the total number of unique sets of operating parameters, such that multiple cells or cell groups share a common set of operating parameters applied when reading from or writing to the cells or cell groups. Operating parameter sets may therefore attempt to represent an overall "best fit" for the cells or cell groups to which they are applied, rather than representing optimal operating parameters for each such cell or cell group.

BRIEF DESCRIPTION OF THE DRAWINGS

Systems and methods that embody the various features of the invention will now be described with reference to the following drawings, in which:

FIG. 3 is an illustrative visualization of a collection of operating parameter sets that may be applied by a data storage device of FIG. 1 when reading from or writing to memory cells within a data block.

DETAILED DESCRIPTION

Figure 1:
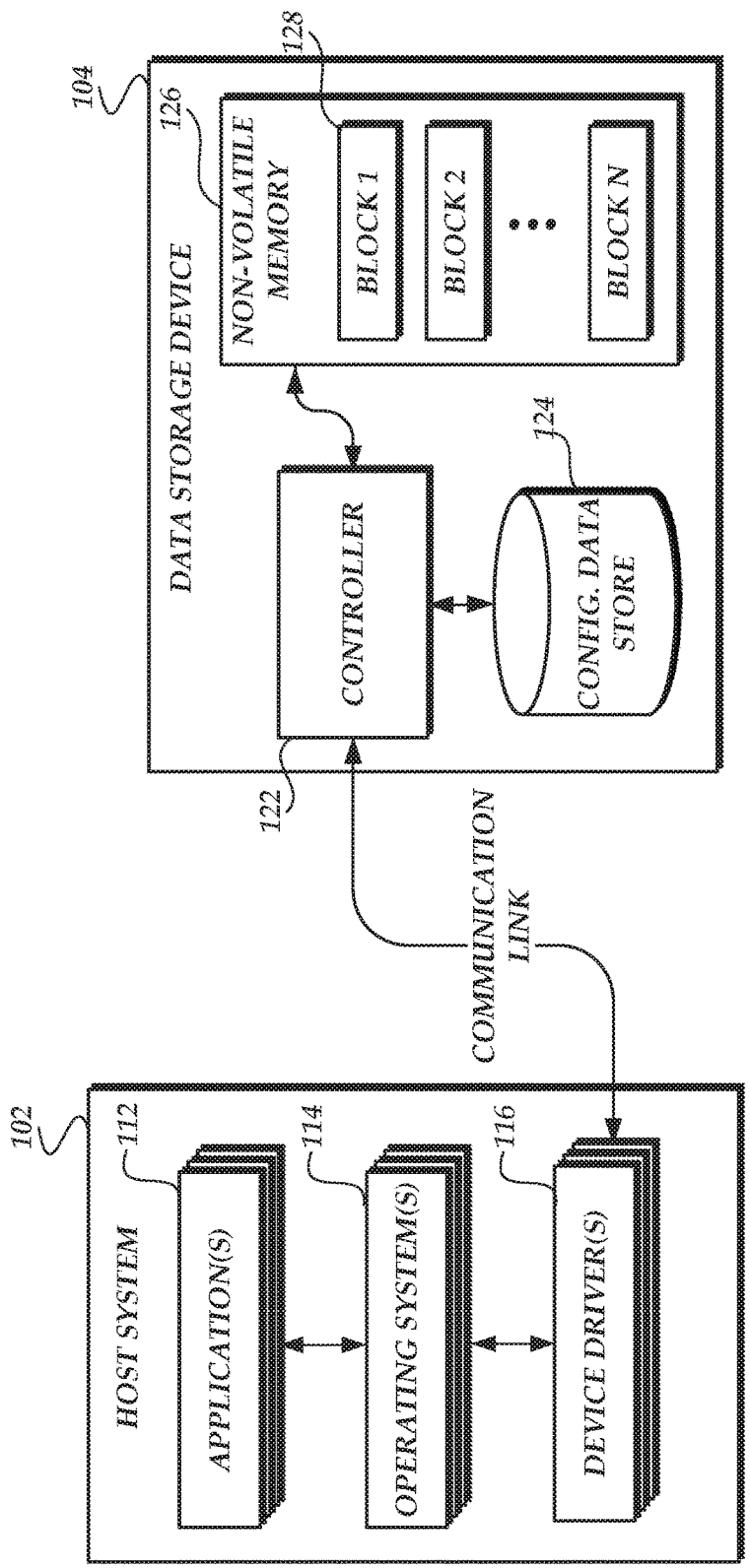
FIG. 1 is a block diagram illustrating a combination of a host system and a data storage device according to some embodiments of the present disclosure.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Generally, some embodiments of systems and methods described herein improve the performance of a flash memory device by providing efficient, accurate algorithms and processes for compacting multiple operating parameter sets on the device into a single operating parameter set. Moreover, some embodiments of the systems and methods described herein can increase the accuracy of such operating parameter sets when applied to specified groupings of cells within a flash memory device, by enabling modifications to such operating parameter sets when applied to specific groupings of cells. Generally described, operating parameters establish parameters used to read to or write from a memory cell or group of memory cells (e.g., data blocks or wordlines) within a flash memory device. While it may be possible for a device to determine optimal operating parameters for each memory cell or group of cells within the device, such a process may significantly increase the computing resources required at the device (e.g., in terms of memory to store the operating parameters for each cell or group of cells, in terms of processing cycles required to retrieve and apply the correct operating parameters when writing to a cell or group of cells, etc.). To limit such increases, the flash memory device can be configured to allow storage a predetermined number of operating parameter sets, and to assign each cell or group of cells to a given operating parameter set from that number of sets.

Illustratively, a device can be configured to store 48 operating parameter sets, and to use one of such 48 sets to read from or write to each memory cell or group of memory cells within a device. At various points within the operating life of a device, the device may determine whether a current set of operating parameters is appropriate for a given cell or group of cells (e.g., whether use of the operating parameters results in an error rate for the cell or cell group of less than a threshold amount). Depending on usage, memory cells in a device may be impacted differently, and over time re-calibration of operating parameters may be needed. If the current set of operating parameters is not appropriate, the device may attempt to determine a new set of operating parameters for the cell or cell group, and to store that new set of operating parameters as one of the allowed number of sets. If the allowed number of operating parameter sets has not yet been reached, the device may simply store the new operating parameter sets. However, if the device already maintains the maximum allowed number of operating parameter sets, the device can be required to compact two or more operating parameter sets into a single operating parameter set, thus reducing the number of maintained sets to under the allowed number and enabling storage of a new operating parameter set.

Generally, it is beneficial to compact the two "most similar" operating parameter sets, to result in a new set that will provide satisfactory operating parameters for cells or cell groups associated with the two compacted sets. However, as the number of operating parameters in a set rises, so does the computational complexity required to compare each parameter of each group, and to determine the "most similar" sets. Thus, it would be beneficial to enable a device to efficiently compare different operating parameter sets to determine one or more similar sets for compaction, without requiring the device to exhaustively compare each parameter of each set. As discussed below, the present disclosure enables a device to do so, by enabling a device to interpret an operating parameter set as an n-dimensional data point, and then compare each set by reducing the dimensionality of such data points (representing operating parameter sets), thus increasing the efficiency with which operating parameter sets can be compacted. Moreover, as discussed in detail below, aspects of the present disclosure enable the use of "offsets" for operating parameter sets, which modify operating parameters within an operating parameter set based on a specific memory cell to which the operating parameters are being applied. These offsets can significantly increase the accuracy of operating parameter sets without increasing the number of operating parameter sets maintained at a flash memory device.

Operating parameters can include any parameters used by a flash memory device to write to or read from memory cells or memory cell groups, and which can vary between memory cells or cell groups. For example, operating parameters can include a set of read voltage thresholds for a block of memory cells (representing a logical grouping of memory cells), used to distinguish between various potential values stored by the block of memory cells. Another example of an operating parameter can be the number of "soft bits" stored by a block of memory cells. Generally described, soft bits can be used to indicate a reliability of the information stored in a memory cell. Example uses of soft bits are described in more detail in U.S. Patent Application Publication No. 2017/0046220 to Sharon et al., entitled "Soft Bit Techniques for a Data Storage Device," the entirety of which is hereby incorporated by reference. Still other examples of operating parameters can include voltage levels or increments used to write data to a data block or error correction mechanisms applied to the data block. In one embodiment, an operating parameter may include a determined quality class of a data block. Systems and methods for determining block quality class are described in more detail in U.S. Patent Application Publication No. 2018/0357535 to Shulkin et al., entitled "Identifying Memory Block Write Endurance Using Machine Learning," (the "'535 Publication") which is hereby incorporated by reference in its entirety.

As an illustrative example, consider an instance in which a flash memory device uses 3-bit per cell MLC memory, and maintains operating parameter sets including seven read voltage thresholds corresponding to the seven potential states of each 3-bit cell. Further assume that the device is configured to store no more than 48 different operating parameter sets (each representing a different collection of seven read voltage thresholds), and that the device is configured to reassess the operating parameter set applied to a data block at various points during operation, such as when the data block completely written with data or when a bit error rate (BER) is detected at the data block of above a threshold level. When the device operating parameters for a data block are reassessed, the device may first attempt to assign one or more existing parameter sets for use in reading from the data block. For example, the device may attempt to read the data block using read threshold values established for one or more most recently established operating parameter sets, and determine whether such parameters result in adequate performance of the data block (e.g., a bit error rate under a threshold level). If existing operating parameter sets do not result in adequate performance, the device may attempt to establish a new operating parameter set. For example, the device may programmatically determine a set of optimal read threshold values for the data block, and attempt to store the determined optimal read threshold values as a new operating parameter set.

Various algorithms for determining optimal read threshold values are known in the art. One example of such an algorithm is described within the U.S. Patent Publication No. 2014/0355340 to Sharon et al., entitled "Updating Read Voltages" (the "'340 Publication") which is hereby incorporated by reference in its entirety. (Note that the term "optimal" as used with respect to "optimal read threshold values" is intended to refer to read thresholds selected according to an evaluation metric of an algorithm for determining such values, such as a minimization of error rate when reading data from a memory cell, as is not intended to imply that such values are in fact optimal under all conditions or with respect to all metrics.) In the instance that less than 48 total operating parameter sets are currently maintained by the device, the determined optimal read threshold values can be established as an additional operating parameter set without modifying existing sets. However, if the device currently maintains the 48 allowed operating parameter sets, the device may be required to "compact" two or more existing operating parameter sets into a single operating parameter set, to allow for storage of the new operating parameter set.

One mechanism for compacting operating parameter sets is to exhaustively compare all values of all sets, and to determine to sets with a maximum overall similarity. For example, where operating parameter sets include seven read voltage thresholds (e.g., for use with 3-bit per cell MLC memory), a device can be configured to compare each combination of two operating parameter sets, determine a difference of each of the seven read voltage thresholds between the two sets, and utilize the total difference between the seven read voltage thresholds as a "distance" metric inversely correlated to similarity. The device may then determine the two sets with a minimum distance metric as the most similar, and "compact" the two sets into a single set (e.g., with seven read voltage thresholds each representing an average of the respective thresholds of the two prior sets). One of the two prior sets may be replaced with the determined single set, and the other prior set may be discarded to make room for a new set. While the process of exhaustingly comparing distances between each set may result in reliable identification of the two most similar sets, this process can be both computationally intensive (e.g., in terms of processing cycles and memory), and thus result in significant decreases in performance if implemented in practice.

To reduce the computational complexity required to locate similar data sets, a device according to some embodiments of the present disclosure can be configured to represent each operating parameter set as an n-dimensional data point, and to reduce the dimensionality of that data point such that "nearby" data points within the reduced dimensionality space can be identified for compaction. By viewing operating parameter sets as data points within a reduced dimensionality space, the computational complexity required to locate similar operating parameter sets can be reduced, and thus the performance of a flash memory device can be increased relative to prior implementations.

In one embodiment, a flash memory device can be configured to transform each operating parameter set into a 1-dimensional data point—a single value representative of the operating parameter set. For example, it has been determined experimentally that variances between different sets of optimal read voltage thresholds tend to shift within the same direction under changing conditions. For example, in 3-bit per cell MLC memory, variances in temperature of a data block tend to shift optimal values for each of the seven read voltage thresholds either up or down, as opposed to causing some of the seven read voltage thresholds to shift up, while simultaneously causing others to shift down. It is expected that read voltage thresholds for other memory types would also demonstrate positive shift covariance. While the magnitude of drift is not necessarily constant across the seven read voltage thresholds, this finding nevertheless presents an opportunity to reduce an operating parameter set containing seven read voltage thresholds into a single dimensional value, representative of the overall shift in the seven thresholds. Accordingly, in one embodiment, a flash memory device may apply an equation to voltage thresholds within an operating parameter set to result in a single value representative of the set. For example, a device containing 3-bit per cell MLC memory may combine seven voltage thresholds within each maintained operating parameter set by summing the seven thresholds (or a value derived from the seven voltage thresholds, such as a square of each threshold), to result in a single dimensional data point for each operating parameter set. Thereafter, the single dimensional data points may be sorted, and the two closest data points (in terms of difference of value in the single dimension) can be selected for compaction. Thus, a flash memory device is enabled to greatly simplify the problem of locating similar operating parameter sets, by reducing the sets to a 1-dimensional data point.

In another embodiment, a flash memory device is configured to reduce the dimensionality of each operating parameter set by application of principal component analysis to parameters within an operating parameter set. Principal component analysis ("PCA") is a known statistical process, and thus will not be described in detail herein. However, in brief, such analysis can include generation of a covariance matrix from a set of potentially interrelated, n-dimensional data points, and performing eigendecomposition on the covariance matrix—a process by which the matrix is decomposed into eigenvectors and eigenvalues. Each eigenvector represents a "principal component" of the data points, and has a corresponding eigenvalue representative of the amount of variance between the data points accounted for by the eigenvector. Thus, generally described, an eigenvector with a highest corresponding eigenvalue can be expected to represent a largest proportion of the information within a set of data points (relative to other eigenvectors), and the data points can be expressed in terms of location along that eigenvector (with the highest corresponding eigenvalue) to reduce the data points into a single-dimensional set of data while maintaining a large portion of the informational value of the data points. Data can be expressed in terms of multiple eigenvectors (e.g., of descending eigenvalues) to represent progressively more information within the set of data points. A representation of a data point in terms of an eigenvector can be conceptualized as a single dimensionality of the data point. Thus, an n-dimensional data set can be reduced to any lower number of m dimensions by application of PCA, to result in a representation of each point within the set according to the m eigenvectors with the highest corresponding eigenvalues.

With application to the compaction of operating parameter sets in a flash memory device, each operating parameter sets may be logically represented as an n-dimensional data point, where n is the number of operating parameters within the set. By application of PCA, each n-dimensional data point (corresponding to an operating parameter set) can be reduced in dimensionality, to reduce the computing resources required to locate similar sets (where similarity can be represented by the distance between each data point within a reduced dimensionality space). For example, if PCA is used to reduce operating parameter sets to a single dimensional value each, these values can be sorted, and the two closest values selected as the most similar operating parameter sets. Thus, a flash memory device is enabled to greatly simplify the problem of locating similar operating parameter sets, by reducing the sets to any number m of dimensions (where m is less than an original dimensionality of the sets).

In some instances, it may be advantageous for a flash memory device to compact more than two operating parameter sets within any given compaction operation. For example, if a device is configured to combine only two operating parameter sets during a compaction, it may be probable that another compaction will be required in the near future (e.g., as a next new set of operating parameters is required at the device), incurring further computing resources of the device. In some such instances, a device may iteratively compact operating parameter sets, by repeatedly compacting two "nearest" sets in terms of a reduced dimensionality representation, until a desired compaction level is reached (e.g., a the number of maintained sets falls below a threshold level). In other embodiments, a flash memory device may be configured to compact multiple operating parameter sets into a single set via a single compaction operation. For example, in some embodiments, a flash memory device applies cluster analysis to operating parameter sets, in order to determine a "cluster" of similar operating parameter sets that can be compacted into a single operating parameter set.

A variety of cluster analysis techniques are known in the art, such as the k-means clustering and expectation maximization algorithms. Each such technique generally analyzes data sets in a dimensional space, and selects from the data sets "clusters" of related sets that are related by distance in that dimensional space. Thus, a flash memory device may be configured to apply view operating parameter sets as data points within a dimensional space, and to apply a clustering algorithm to select clusters of such data points. Because the computing resources required to conduct cluster analysis generally increase with the dimensionality of the data set, a device may be configured to apply cluster analysis on reduced dimensionality data set, such as a data set generated by applying PCA to operating parameter sets. After identifying a cluster of data points, the device may then compact each operating parameter set corresponding to a data point within a cluster, to result in a single operating parameter set of the cluster. Particularly where operating parameter sets are highly clustered, compaction based on clustered data points (corresponding to similar operating parameter sets) can enable the device to significantly reduce a number of maintained operating parameter sets. For example, where 48 current operating parameter sets can be represented by 4 clusters, a device may compact all 48 operating parameter sets into just four sets, corresponding to each identified cluster. Accordingly, a flash device is enabled to efficiently compact multiple operating parameter sets.

As discussed above, due to the limited number of operating parameter sets generally maintained by a flash memory device, it is possible that a parameter set applied to a data block is suboptimal with respect to at least a portion of the memory cells within that data block. For example, within NAND memory, memory cells in a data block are generally arranged within word lines, each representing a set of memory cells that are read simultaneously by application of voltage to the data block. Due to physical variations within a NAND block, optimal read voltage thresholds can vary across word lines. Thus, a common set of operating parameters (e.g., read voltage thresholds) may represent acceptable parameters for some word lines within a block, but result in increased errors when applied to other word lines within a data block. However, because a device may be configured to limit its total number of maintained operating parameter sets, it may be difficult to apply unique operating parameter sets to each different wordline within a block without exceeding a constraint on total parameter sets. To address this problem, a device according to some embodiments of the present disclosure may be configured to determine "offsets" or modifications to be made to operating parameters that would otherwise be applied to a block, based on a physical location of a word line to which the operating parameters will be applied.

To determine such offsets, a flash memory device can be configured to determine a number of operating parameters (e.g., read voltage thresholds) for different wordlines within data block, and to determine a difference between those optimal operating parameters and the operating parameters that would otherwise be applied to the wordlines (e.g., the operating parameters applied across the block). The flash memory device may then process that difference (which may include, for example, differences for each parameter within an operating parameter set) via a machine learning algorithm, such as a neural network, in order to determine correlations between a location of a wordline within a data block and offsets to the operating parameters of the data block. This correlation information may represent, for example, that a specific wordline within a block (e.g., wordline 1) tends to be associated with optimal read voltage thresholds a given amount (e.g., 0.25 volts) below what would otherwise be applied to the block, or that specific read voltage thresholds (e.g., a first threshold) for that wordline tends to be optimal at a lower voltage than the voltage otherwise set for the remainder of the block. Illustratively, these offsets may correspond to wordline locations within a data block, regardless of the specific data block. Thus, the correlations can be represented in a relatively small amount of memory (e.g., one parameter modification set per number of wordlines in each data block).

Thereafter, the device may be configured to apply determined offsets when applying operating parameters to wordlines within a data block. For example, where the offsets relate to read voltage thresholds and a flash memory device is attempting to read a first wordline of a first data block, the device may first determine the read voltage thresholds that should be used for the first data block (e.g., as including in one of the limited number of operating parameter sets maintained at the device), and then modify those read voltage thresholds by the offsets determined for first wordlines (e.g., the first wordline in each block). Because the offsets are determined based on correlations to optimal read voltage thresholds on a per-wordline basis, the modified read voltage thresholds for the first wordline of the first block would be expected to more accurately represent true optimal read voltage thresholds for the wordline. Thus, application of offsets to operating parameters on a per-wordline basis can improve the ability of the device to read from or write to that wordline.

While illustrative examples are described herein with respect to specific groupings of memory cells (e.g., data blocks or wordlines), embodiments may function with respect to any number of different groupings, or with respect to individual memory cells. For example, embodiments of the present disclosure may establish operating parameter sets at a per die level, or across multiple memory dies. Embodiments of the present disclosure may further establish offsets for specific blocks of memory (e.g., based on the location of block), or for any other characteristic of a memory cell or collection of cells. Thus, the examples provided herein are intended to be illustrative in nature.

The above will be more fully appreciated and understood with reference to the following description.

System Overview

FIG. 1 illustrates one example configuration of a host system 102 and data storage device (or memory device) 104 in accordance with some embodiments of the present disclosure. As shown in FIG. 1, the host system 102 generally includes one or more logical applications 112, operating systems 114, and device drivers 116. Such applications 112, operating systems 114, and device drivers 116 can represent logical software modules executed by underlying hardware components of the host system 102 (not shown within FIG. 1). Hardware components of the host system 102 may include, for example, one or more physical processors, application-specific integrated circuits (ASICs), field programmable gate arrays (FPGAs), communication busses, volatile or non-volatile storage media, input devices, or output devices. Components of the host system 102 which enable logical applications 112, operating systems 114, and device drivers 116 are well known to those skilled in the art, and therefore will not be described in more detail herein.

The applications 112 and operating systems 114 may provide various functionalities to users of the host system 110 which require or are assisted by storage of data within the data storage device 104. Accordingly, the host system may include one or more device drivers 116 configured to enable transmission of data storage commands (e.g., read or write commands) to the data storage device 104. Such commands may be transmitted via a communication link between the host system 102 and the data storage device 104. In one embodiment, the communication link may include a storage bus, such as a serial ATA (SATA) storage bus or other storage bus utilizing the advanced host controller interface (AHCI) standard. In another embodiment, the communication link may include a system bus, such as a Peripheral Component Interconnect (PCI) or PCI Express bus. In still other embodiments, the communication link may include network communication links (e.g., Ethernet links enabling communication via transmission control protocol (TCP)/internet protocol (IP) standards), a universal serial bus (USB) link, or any of a variety of known data storage communication links.

The data storage device 104 includes the non-volatile memory 126 coupled to a controller 122. The controller 122 may enable the host system 102 to write to and read from the non-volatile memory 126, and perform other functionalities related to maintenance or operation of the data storage device 104, some of which are described below. The controller 122 may thus include a processor and memory configured to implement these functionalities. Data related to a configuration of the controller 122 may be stored in configuration data store 124, which may correspond illustratively to random access memory (RAM), read only memory (ROM), or a combination thereof. This data may include, for example, operating parameter sets that designate, for example, how the controller 122 operates to write data to or read data from the non-volatile memory 126. The number of operating parameter sets may be limited based on a configuration of the device 104. For example, the device 104 may be configured to store within the configuration data store 124 no more than 32 or 48 operating parameter sets, which can be applied to various logical groups within the non-volatile memory 126. In accordance with some embodiments of the present disclosure, the configuration data store 124 may further include offset information, denoting modifications to be made to an operating parameter set when reading from or writing to specific memory cell groups (e.g., wordlines) based on characteristics of those groups.

In one instance, the non-volatile memory 126 is a NAND flash memory. The NAND flash memory may include, for example, single-level cell (SLC) memory, multiple-level cell (MLC) memory, or a combination thereof. MLC memory may include 2-bits per cell memory, 3-bits per cell memory (known in some instances as "triple level cell," or TLC, memory), 4-bits per cell memory known in some instances as "quad level cell," or QLC, memory), etc. Cells within the non-volatile memory 126 can be organized into physical or logical groups. In the illustrative example of FIG. 1, the cells are organized into a plurality of blocks 128 (depicted in FIG. 1 as blocks 1 through n). One potential configuration of a block 128 is described below with respect to FIG. 2.

Operation of non-volatile memory 126, such as NAND memory, is known in the art and thus will not be described in detail herein. However, for the purposes of description of embodiments of the present disclosure, one skilled in the art will appreciate that non-volatile memory 126 has measurable characteristics that vary among blocks 128 (e.g., due to variances in manufacturing of the non-volatile memory 126). For example, because memory cells store information in the form of varying levels of voltage, each block 128 can be associated with one or more voltage thresholds that distinguish different information stored by the cell. For example, a stored voltage of between 0.375 and 1.125 volt may indicate a first value (e.g., the bit string "110"), a stored voltage of between 1.125 and 1.875 volts may indicate a second value (e.g., the bit string 100), etc. To distinguish between stored values, a storage device 104 may establish one or more read thresholds for a block 128, such that if the stored voltage at the block 128 is below a first threshold, it is determined to store a first value, if the stored voltage at the block 128 is above the first threshold and below a second threshold, it is determined to store a second value, etc. The number of read thresholds established for a cell generally varies with the number of bits storable by the cell. For example, SLC memory generally establishes a single read threshold value, while 2-bit MLC establishes 3 read threshold values, 3-bit MLC establishes 7 read threshold values, 4-bit MLC establishes 15 read threshold values, etc. The controller 122 can be configured to determine optimal read threshold values according to a predetermined algorithm. Various such algorithms for determining optimal read threshold values are known in the art. One example of such an algorithm is described within the '340 Publication, incorporated by reference above.

Other characteristics of blocks 128 can include, for example, times required for the controller 122 to successfully write to a block, a time required to erase a block 128, a number of failed bits detected at a block 128 (e.g., instances in which the controller 122 attempted to write a bit value to a block 128 but after which the controller 122 failed to read that bit value from the block 128), a bit error rate (BER) of a block 128, or a number of programming loops required to set a block 128 to a desired value (e.g., successive applications of voltage to the block 128 to cause the block 128 to maintain a desired voltage level). In accordance with general operation of NAND devices, these characteristics may vary across blocks 128 of non-volatile memory, across wordlines within blocks 128, or across other groupings of memory cells.

To address variances within groupings of memory cells, a device 104 may include different operating parameter sets, to be applied to different groupings. For example, the controller 122 may be configured to apply different operating parameters to different blocks 128. In one instance, a device 104 may include a set of "default" operating parameters to be applied to each block 128, and may re-evaluate the operating parameters during the life of the device 104. For example, a controller 122 may re-evaluate operating parameters of a block 128 when the block 128 has been completely written to, when reading from a block 128 results in a threshold number of errors, or when a bit error rate (BER) of the block 128 exceeds a threshold amount. Re-evaluation of operating parameters may include determining a set of optimal operating parameters for the block 128, and attempting to store those optimal operating parameters for the block 128 as a new operating parameter set within the configuration data store 124. (Various mechanisms for determining optimal operating parameters of a block 128 are known in the art. For example, systems and methods for determining optimal read voltage thresholds for a data block 128 are disclosed in the '340 Publication, incorporated by reference above.) In the instance that the device 104 has not yet stored a maximum number of unique operating parameter sets, the optimal operating parameters may be stored as a new set of operating parameter within the configuration data store 124. However, in the instance that the device 104 has already stored the maximum number of operating parameters, the controller 122 may be configured to compact at least two operating parameter sets into a single operating parameter set, to enable storage of the new operating parameter set within the configuration data store 124.

As discussed above, compaction can in some instances require a controller 122 to determine two "most similar" operating parameter sets within a collection of stored sets. Such a determination can be computationally complex and resource intensive, and that complexity and intensiveness generally increases as the number of parameters within each operating parameter set increases. To address this issue, a controller 122 can be configured to represent each operating parameter set within a collection of sets as a multi-dimensional data point, with each dimension corresponding to a different parameter of the multi-dimensional set. Further, the controller 122 can be configured to reduce the dimensionality of such data points, in order to reduce the computational resources required to locate similar operating parameter sets. Algorithms for reducing dimensionality of data points are discussed in more detail below, but in brief may include combining parameters within an operating parameter set according to a predetermined equation (e.g., a linear combination), or conducting principal component analysis on the data points and representing the data points with respect to an n highest value eigenvectors of the data points (e.g., eigenvectors with the n highest corresponding eigenvalues). After reducing dimensionality of data points, the controller 122 may determine at least two closest-distance data points, and select operating parameters corresponding to the data points as "most similar" for the purposes of compaction. Additionally or alternatively, the controller 122 may apply cluster analysis to the data points to determine clusters of data points, and thereafter compact the operating parameter sets corresponding to each cluster into a single operating parameter set.

Furthermore, the controller 122 in some embodiments may be configured to determine offsets for specific groupings of memory cells, such as wordlines within a block 128, such that operating parameters that would otherwise be applied to the grouping can be varied on a per-grouping basis. As discussed above, use of such offsets can enable more accurate operation of memory cell groupings, without requiring the device 104 to maintain an increased maximum number of operating parameter sets. Algorithms for determining offsets according to a location or other characteristics of a memory cell group are discussed in more detail below.

Illustrative Block Configuration

Figure 2:
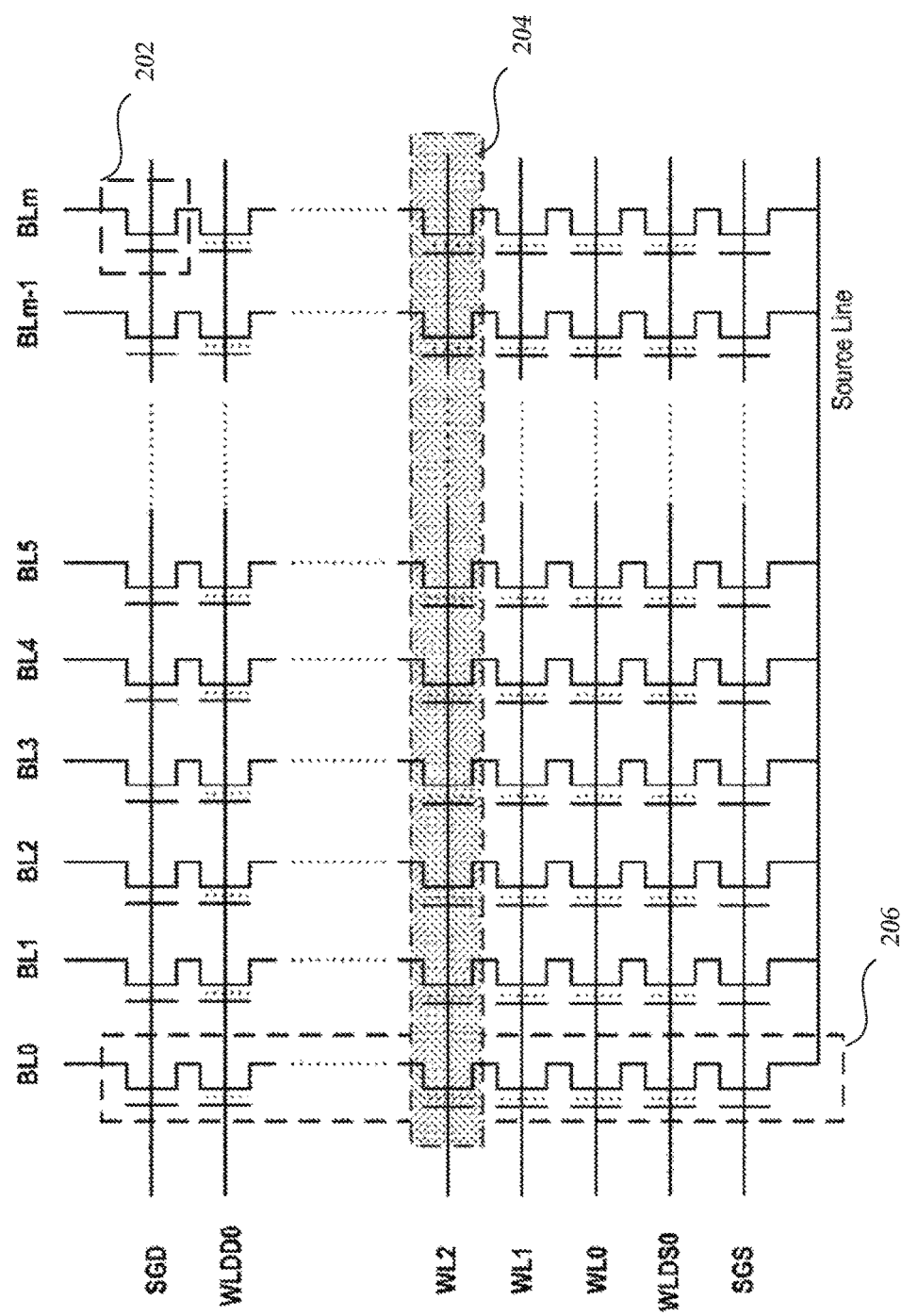
FIG. 2 is an illustrative visualization of a data block within a data storage device of FIG. 1.

One illustrative example of a configuration of a block 128 within non-volatile memory 126 is shown in FIG. 2. As shown in FIG. 2, the block 128 may include a number of memory cells 202 arranged within a grid. Rows of the grid can represent a wordline 204 within the block 128, which may be read from or programmed in parallel. While a block 128 may include any number of wordlines 204, an illustrative number of wordlines 204 is shown in FIG. 2. Columns of the grid can represent bitlines 206. A device 104 may apply appropriate voltages to various bitlines 206 and wordlines 204 in order to read voltages stored within cells 202 of a particular wordline 204. The voltage read from a given cell 202 can represent a state of the cell, and a corresponding number of logical bits represented by the cell. Various possible states for the cell are generally represented by read voltage thresholds, each of which corresponds to a given state. For example, a voltage between a first read voltage thresholds and a second read voltage threshold may represent a first state, a voltage between a second read voltage thresholds and a third read voltage threshold may represent a second state, etc. However, due to physical constraints of cells 202, it may not be practical or possible set an exact voltage level on a cell 202. Thus, a controller 122 can be configured to determine optimal read voltage thresholds for as cell 202, that enable the cell to be read from with minimal error rates. In some instances, the optimal read voltage thresholds may vary depending on a location of a cell 202 within a block 128. For example, a set of read voltage thresholds may tend to shift (e.g., increase or decrease) between wordlines 204 within the block 128. Systems and methods for determining optimal read voltage thresholds are discussed, for example, in the '340 Publication, incorporated by reference above. As discussed above, a device 104 may store optimal read voltage thresholds for a block 128 (e.g., alone or among other data) as an operating parameter set for the block 128. However, the device may be limited in the maximum number of different operating parameter sets stored in the device 104.

Illustrative Operating Parameter Sets

One illustrative visualization or graphical depiction of operating parameter sets that may be maintained by a device 104 is shown in FIG. 3. Specifically, FIG. 3 depicts a portion of a table of 48 operating parameter sets, each set corresponding to a set of seven read voltage thresholds that may be used to read a state of cells 202 in 3-bit per cell MLC memory. The read voltage thresholds are labeled TH1-TH7, and represent example voltages used to distinguish states of a cell 202. For example, the first operating parameter set indicates that a voltage of under 0.49 voltage indicates a first state (e.g., an erase state), a voltage of between 0.49 and 1.35 volts indicate a second state (e.g., a state representing the bitstring 001), a voltage of between 1.35 volts and 2.05 volts represents a third state, etc. As can be seen in FIG. 3, the specific voltages for any given threshold may vary between the operating parameter sets. Accordingly, a device 104 may be configured to assign each block 128 of a non-volatile memory 126 to one of the operating parameter sets, and to utilize the thresholds of the set when reading information from the block 128. Because a device 104 can be configured not to exceed a maximum number of operating parameters, the thresholds used to read information from a given block 128 may not represent optimal read voltage thresholds for the block 128. Nevertheless, the controller 122 may attempt to assign a block 128 to an operating parameter set that achieves acceptable performance when applied to the block 128 (e.g., a bit error rate of under a threshold value), or else attempt to establish a new operating parameter set for the block 128. Because such a new operating parameter set may be required to be stored as one of the 48 sets depicted in FIG. 3, establishment of a new operating parameter set may require compacting at least two sets into a single operating parameter set. However, as can be seen in FIG. 3, it is non-trivial to compare the various thresholds of each operating parameter set to determine which sets should be compacted.

While the operating parameter sets of FIG. 3 include read voltage thresholds for a cell 202, various other operating parameters may be included within a set in accordance with the present disclosure. For example, an operating parameter set may include an indication of whether "soft bits" are applied to a cell 202, and voltage thresholds to be used in identifying values of soft bits. Other operating parameters can include, by way of non-limiting example, voltage increments to be applied when writing to a cell. While the illustrative table of FIG. 3 represents a device 104 maintaining a maximum number of operating parameter sets, in some instances a device 104 may maintain fewer than the maximum number of sets. In other instances, a device 104 may maintain metadata or other information designating operating parameter sets as deprecated or otherwise subject to deletion. Thus, the operating parameter sets of FIG. 3 are intended to be illustrative in nature.

Routine for Compacting Operating Parameter Sets

Figure 4:
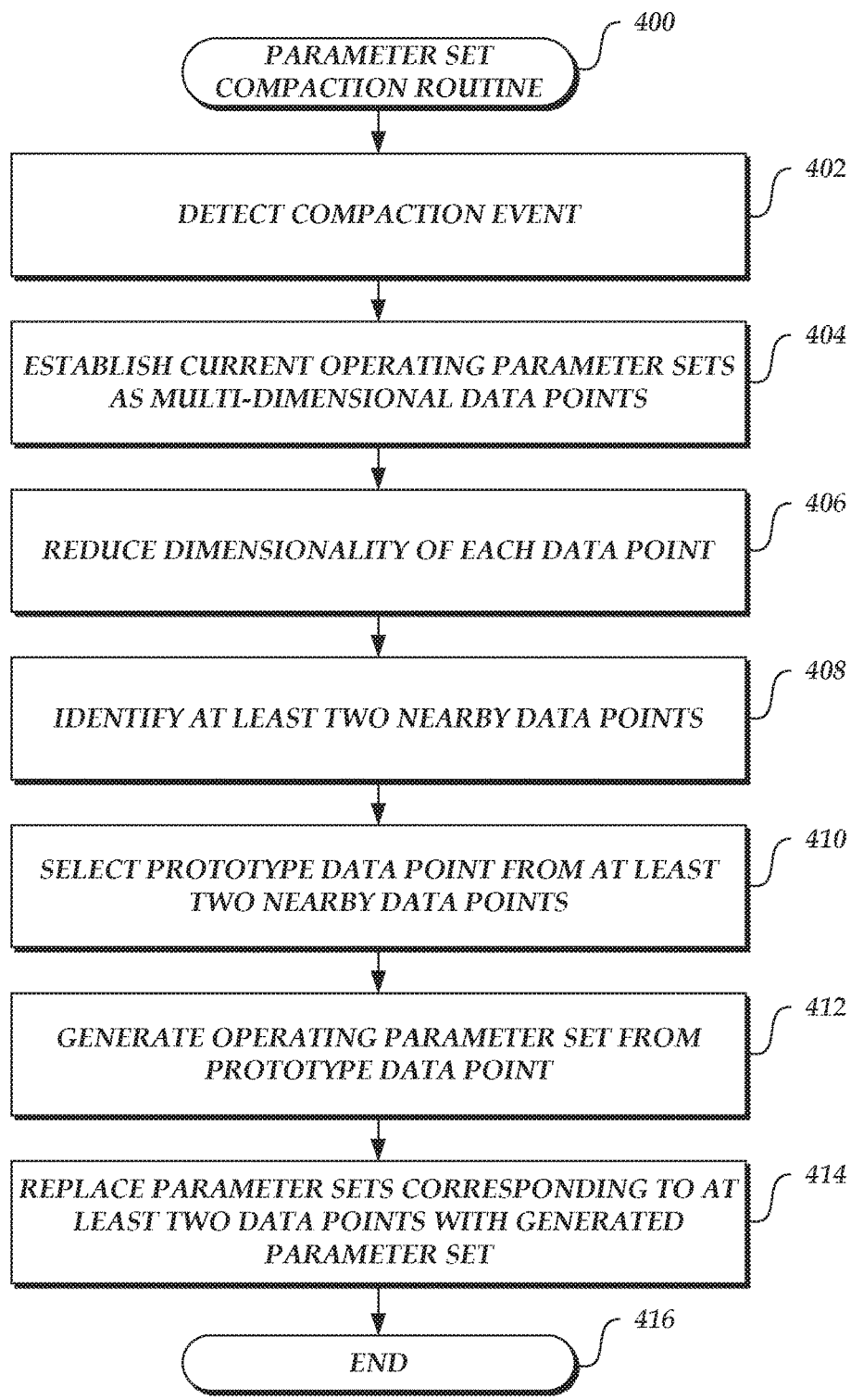
FIG. 4 is an illustrative routine for compacting operating parameters sets by identifying similar operating parameter sets according to a reduced dimensionality of the sets.

FIG. 4 is a flow diagram illustrating a routine 400 for compacting two or more operating parameter sets maintained at the device 104 into a single operating parameter set. The routine 400 may be implemented, for example, by a controller 122.

The routine 400 begins at element 402, where the controller 122 detects a compaction event. In some instances, the compaction event may include a detection, by the controller 122, that the device 104 is maintaining above a threshold number of operating parameter sets (e.g., at or near a maximum number of sets). In other instances, the compaction event may include a detection that the device 104 is maintaining a maximum number of operating parameter sets, and that a new operating parameter set should be generated and stored (e.g., in response to detection that a data block 128 is experiencing a BER above a given level). In still other instances, the compaction event may be a periodic event, such as a scheduled compaction occurring on the device 104 at intervals of n hours.

At element 404, the controller 122 can establish a current collection of operating parameter sets as a collection of multi-dimensional data points, each data point corresponding to an operating parameter set of the current collection of operating parameter sets. Illustratively, each parameter type (e.g., threshold "TH1" of FIG. 3) within a given operating parameter set can be logically represented as a dimension of a data point, and the parameter value for that parameter type (e.g., a given voltage) can be logically represented as a value of that dimension. Thus, where each operating parameter set includes n parameter values, each set can be represented as an n dimensional data point. In one embodiment, the controller 122 may establish current operating parameter sets as a collection of multi-dimensional data points by loading the operating parameter sets from the configuration data store 124 into a multi-element data structure, such as an array, linked list, or the like (e.g., with each entry representing a single multi-dimensional data point corresponding to a given operating parameter set).

As discussed above, it is generally non-trivial to identify compare data points within multi-dimensional space (e.g., to identify the two closest data points or groupings of data points), and the complexity of this problem generally increases proportionally to the number of dimensions of each data point. Thus, in order to facilitate identification of nearby data points (each of which can represent an operating parameter set), the controller 122, at element 406, can reduce the dimensionality of each data point.

In one embodiment, the controller 122 is configured to reduce each data point to a single dimension. For example, the controller 122 may utilize an equation combining the values of each parameter into a single dimensional value. The equation may be predetermined, for example, by a manufacturer of the device 104 according to statistical analysis of variance among the parameter values during operation of other devices 104. Illustratively, where operating parameter sets include a set of read voltage thresholds for blocks 128, the equation may combine each read voltage threshold according to a given equation. In one embodiment, this equation is an additive combination of the square of each read voltage threshold. Because it has been experimentally determined that read voltage thresholds tend to shift in the same direction (e.g., up or down in terms of voltage) under varying conditions, such an additive combination can result in a single value that is indicative of an overall shift in read voltage thresholds within an operating parameter set.

In another embodiment, the controller 122 is configured to reduce the dimensionality of the data points by conducting principal component analysis (PCA) of the data points. The general process of PCA is known in the art, and can include identifying a set of orthogonal eigenvectors and corresponding eigenvalues through which the data points can be represented, each eigenvalue indicating a level of variance between the data points that can be expressed in terms of a corresponding eigenvector. With respect to reduction of dimensionality of data points representing operating parameter sets, a controller 122 may apply PCA to the data points by first generating a covariance matrix of the data points. The covariance matrix can represent a covariance between the various dimensions of each data point, and thus represent a relationship between the different dimensions of the data points (e.g., as a positive or negative correlation). Thereafter, the controller 122 can apply eigendecomposition to the covariance matrix, to represent the matrix in terms of a set of eigenvectors and corresponding eigenvalues. Each eigenvector can represent a dimensional vector, expressable in terms of the original dimensions of the data points, along which the data points can be plotted. The eigenvalue corresponding to each eigenvector can indicate a variance of the data points captured by the eigenvector, when the data points are plotted along such eigenvector. Thus, if each of the data points is plotted along an eigenvector with a highest eigenvalue, the data points may be represented as a single dimensional value, while maintaining a "maximum" amount of information relative to plotting the data points along another of the eigenvectors with a smaller corresponding eigenvalue. Because each eigenvector can represent a single dimension of the data points, the controller 122 may reduce the data points to any dimensional level. For example, the controller 122 may reduce the data points to a single dimension by representing the data points with respect to an eigenvector with a highest eigenvalue, to two dimensions by representing the data points with respect to the two eigenvectors with the two highest eigenvalues, etc. The number of dimensions to which the data points are reduced may vary among embodiments of the present disclosure, according to the computing resources available to the controller 122. In one embodiment, the number of dimensions may be static, and set during configuration of the controller 122 (e.g., at manufacturer). In another embodiment, the number of dimensions may be determined dynamically during operation of the controller 122 (e.g., according to an estimated amount of available computing resources or time available to the controller 122 to perform the routine 400). In an illustrative embodiment, the controller 122 is configured to utilize PCA to reduce the data points to one, two, or three dimensional data points.

At element 408, the controller 122 identifies at least two nearby data points of the reduced dimensionality data points. Where the data points have been reduced to a single dimension, element 408 may be implemented by sorting the data points along values in the single dimension, and traversing the sorted data points to identify two data points separated by a minimum distance. These two data points may then be selected for compaction, as discussed below.

Where data points are represented in multiple dimensions (e.g., corresponding to two or more eigenvectors according to PCA), the controller 122 may in some instances identify at least two nearby data points by application of cluster analysis to the data points. A number of different cluster algorithms are known in the art, such as the k-means clustering and expectation maximization algorithms. Generally described, a clustering algorithm operates to locate clusters of interrelated data points within n-dimensional space. Thus, a clustering algorithm may be applied to the reduced dimensionality data points in order to locate clusters of data points with similar dimensional values. Illustratively, where data points are represented in two dimensional space, a first cluster of data points may include high values in a first dimension and low values in a second dimension, and a second cluster of data points may include low values in the first dimension and high values in a second dimension. Because of the nearness of clustered data points across dimensions, these data points can correspond to operating parameter sets that can be compacted into a single operating parameter set.

After identified at least two nearby data points, the controller 122, at element 410, can select a "prototype" data point from the at least two nearby data points, from which to construct a single operating parameter set representative of the operating parameter sets corresponding to the at least two nearby data points. The prototype data point may represent a logical "center" between the at least two data points identified at element 408. For example where the controller 122 at element 408 identified two data points for compaction, the prototype data point may be selected as a centerpoint between the at least two data points. Where the controller 122 at element 408 identified a cluster of data points, the prototype data point may be selected as representative of the cluster. In such an instance, the prototype data point correspond to an existing data point nearest to the center of the cluster, or may be represented a new logical data point at the center of the cluster (e.g., according to a distance weighting to all data points within the cluster). The prototype data point may thus be associated with a position in dimensional space that is "between" the at least two data points identified at element 408.

At element 412, the controller 122 can generate a new operating parameter set based on the selected prototype data point. The mechanism used to generate a new operating parameter set may vary, for example, according to the mechanism used to reduce the dimensionality of the data points at element 406. For example, where PCA is used to reduce the dimensionality of the data points at element 406, a new operating parameter data set may be generated by transforming the prototype data point according to the eigenvectors selected during dimensional reduction. Specifically, because the prototype data point is expressed according to the selected eigenvectors, the prototype data point may be transformed (in geometric space) according to inversions of the selected eigenvectors to result in a new data point expressed in terms of the original dimensionalities of the data points, as established at element 404. Because those original dimensionalities represent the parameters of the original operating parameter sets, the new data point can be readily representing as a new operating parameter set, where each dimensionality of the new data point corresponds to a value of a parameter within the new operating parameter set.

In the instance that other dimensional reductions are applied at element 406, the mechanism for generating a new operating parameter set from the prototype data point may vary. For example, where a linear equation is used at element 406 to reduce the data points to a single dimension, it may not be possible or practical to generate a new operating parameter set solely from the single dimensional value of the prototype data point. Accordingly, the controller 122 in such instances may identify the current operating parameter sets corresponding to each of the at least two nearby data points identified at element 408, and average the values of the current operating parameter sets to result in a new operating parameter set. For example, with respect to the operating parameter sets represented in FIG. 3, if data points corresponding to operating parameter sets one and two are identified at element 406, the controller 122 at element 412 may average each read voltage threshold of operating parameter sets one and two to result in a new operating parameter set (e.g., such that read voltage 1 of the new operating parameter set is 0.485 volts, read voltage 2 of the new operating parameter set is 1.36 volts, etc.).

At element 414, the controller 122 can replace the operating parameter sets corresponding to the at least two data points (select at element 408) with the newly generated operating parameter set. For example, where data points corresponding to sets one and two of FIG. 3 are selected at element 408, the controller 122 may replace the values of the current operating parameter set one with the values of the operating parameter set determined at element 412, thus replacing the current operating parameter set one with the new operating parameter set. Operating parameter set two may be deleted, marked as unused, or otherwise modified to indicate that the set can be replaced with a new operating parameter set. Thus, the operating parameter sets one and two may be compacted into a new operating parameter set. Similarly, where more than two operating parameter sets are identified at element 408, one of the identified sets may be replaced with the new set generated at element 414, and the remaining identified sets can be deleted, marked as unused, or otherwise modified to indicate that the sets can be replaced with new information. In this manner, the operating parameter sets within a cluster can be compacted into a single operating parameter set. Any data blocks 128 previously assigned to a compacted operating parameter set can then be assigned to the new operating parameter set, such that the controller 122 is configured to use parameters of the new operating parameter set when writing to or reading from the data blocks 128. The routine 400 can then end at element 416.

While illustrative interactions are described above with respect to FIG. 4, in some embodiments the routine 400 may include additional or alternative interactions. For example, where a new operating parameter set occurs in element 412 by averaging values of two current operating parameter sets, it may be unnecessary to explicitly select a prototype data point, and element 410 may be omitted. As another example, where application of a clustering algorithm (e.g., at element 408) results in identification of multiple clusters, elements 410 through 414 may occur with respect to each cluster, such that the operating parameter sets corresponding to data points of each cluster are compacted into a single new operating parameter set for each cluster. In some such instances, the controller 122 may implement elements 410 through 414 only with respect to clusters meeting a threshold criteria, such as a maximum distance between points of the cluster or a "density" of data points in the cluster.

As can be seen from the description, the routine 400 may in some instances be implemented by a controller 122, without requiring reads from or writes to non-volatile memory 126. This lack of interaction with the memory 126 may be beneficial, for example, in reducing wear on the memory 126, or in enabling rapid execution of the routine 400 on the controller 122. However, in some embodiments, the routine 400 may be modified to include interactions with the memory 126. For example, the controller 122 in some instances may be configured to test a new operating parameter set (e.g., as generated at element 412) with respect to blocks 128 to which the operating parameter set will be applied. For example, the controller 122 may attempt to determine a bit error rate (BER) resulting from application of the new operating parameter set to the blocks 128, and may assign the new operating parameter set only to blocks 128 meeting a threshold error rate criteria. The controller 122 may then attempt to reevaluate operating parameters for any blocks 128 not meeting the criteria. For example, the controller 122 may attempt to determine optimal operating parameters for those blocks 128 not meeting the criteria, and store the optimal operating parameters as a new operating parameter set. Because storing optimal operating parameters may require compaction, this may result in reimplementation of the routine 400, which may repeat until all blocks 128 are associated with operating parameter sets that, when applied to the blocks 128, result in an error rate below a specified threshold. Thus, the interactions of FIG. 4 are intended to be illustrative in nature.

Implementing Parameter Offsets from Cell Characteristics

As can be understood based on the above, it may be impossible or impractical for a flash memory device, limited to storing a given number of operating parameter sets, to utilize optimal operating parameters for every memory cell or group of memory cells within a non-volatile storage, as the number of different optimal operating parameters may exceed the maximum number of operating parameter sets storable on the device. However, in some instances, it may be possible to vary operating parameter sets within a group of memory cells (e.g., a single block 128), in order to more accurate match the general operating parameters for the group to the specific memory cells to which the parameters are applied. For example, where it is determined that optimal read voltage thresholds tend to vary in a predictable manner among the different memory cells within a group, offsets may be applied by a controller 122 depending on characteristics of the memory cells being written to or read from to better approximate predicted optimal parameters for the cells.

As an illustration, consider that optimal read voltage thresholds may tend to vary among different wordlines 204 within a block 128 of memory 126, e.g., such that earlier wordlines 204 tend to have optimal read voltage thresholds at a lower voltage than later wordlines 204. Thus, it may be advantageous to modify a set of read voltage thresholds for a given block 128 on a per-wordline basis, by lowering the thresholds used to read earlier wordlines 204 within a block 128 and raising the thresholds used to read later wordlines 204 within the block 128. In this manner, it may be possible to reduce errors when reading data stored within wordlines 204 of a block 128. Moreover, because differences in optimal read voltage thresholds may be similar across different blocks 128, offsets to read voltage thresholds may be determined on a per-wordline basis, and applied to wordlines 204 in similar locations relative to multiple blocks 128, reducing the computational resources required to store offsets and to apply them when reading from wordlines 204.

However, correlations between wordlines 204 and differences in read voltage thresholds (relative to the general thresholds applied to a block 128) can be non-trivial, or vary between device 104 (or groups of cells within devices 104, such as dies of memory). Thus, embodiments of the present disclosure enable a device 104 to determine correlations between wordline characteristics (such as location within a block 128) and offsets to a general set of operating parameters applied to the block 128. Specifically, embodiments of the present disclosure enable a device 104 to implement a machine learning algorithm, such as a neural network algorithm, to determine such correlations from a set of input data regarding the non-volatile memory 126. Thereafter, the device 104 can apply the determined offsets when reading from wordlines 204 within the memory 126, in order to increase the accuracy of such reading.

Figure 5:
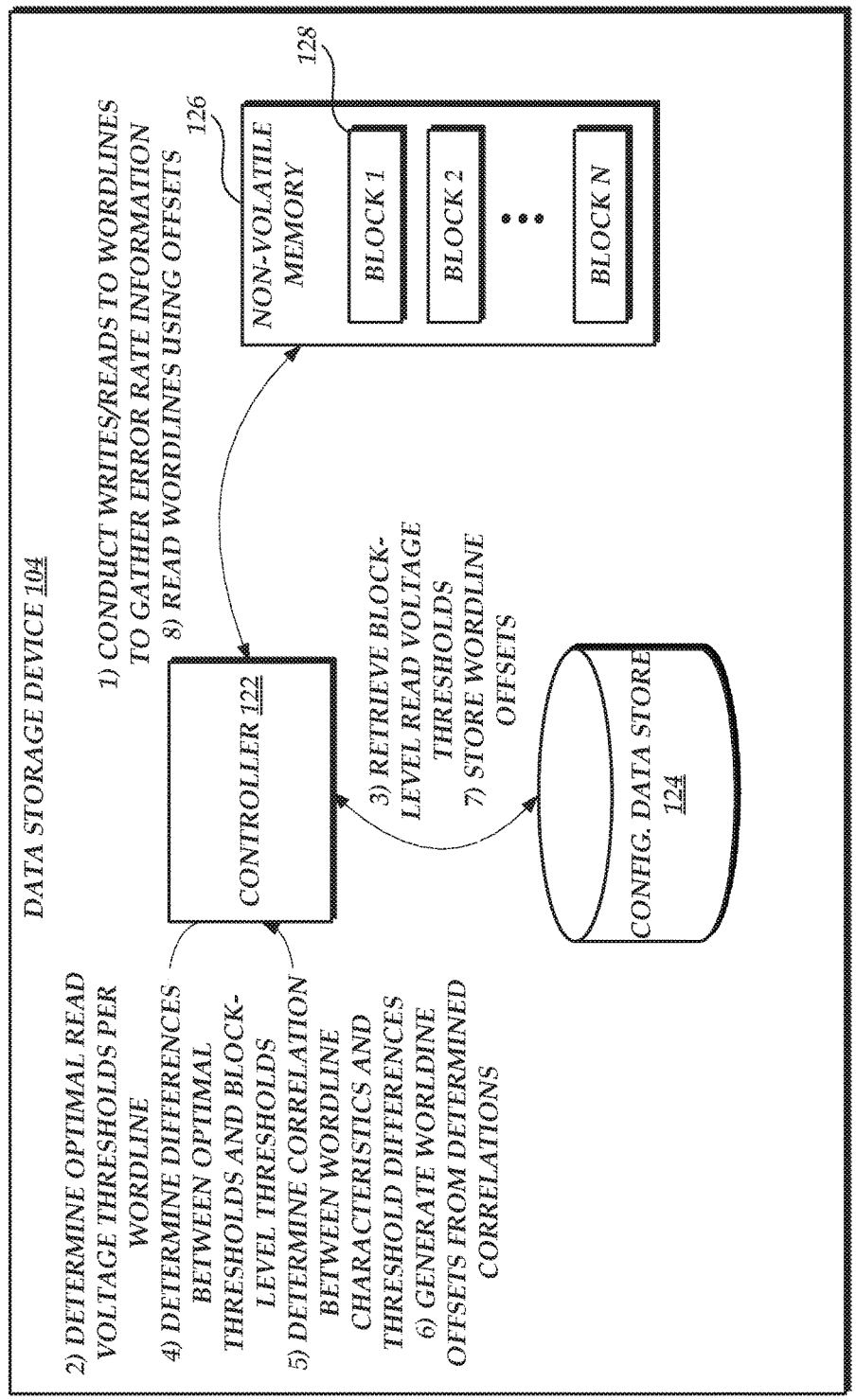
FIG. 5 is a flow-diagram illustrating operation of a data storage device of FIG. 1 to determine read threshold value offsets according to characteristics of a memory cell or group of memory cells, and to modify read value thresholds for the memory cell or group of memory cells according to the offset when reading from the memory cell or group of memory cells.

Illustrative interactions for determining correlations between offsets in operating parameters and characteristics of wordlines 204 are shown in FIG. 5. The interactions begin at (1), where a controller 122 conducts reads and/or writes to wordlines 204 of the non-volatile memory 126 to gather information regarding errors rates on such reads and writes.

Thereafter, at (2), the controller 122 can utilize the gathered information to determine a set of optimal read voltage thresholds on a per-wordline basis. Mechanisms for determining optimal read voltage thresholds are known in the art, and thus not described in detail herein. Examples of such mechanisms are described in more detail within the '340 Publication, incorporated by reference above.

Thereafter, at (3), the controller 122 retrieves block-level read voltage thresholds from the configuration data store 124. As discussed above, the block-level read voltage thresholds can reflect read voltage thresholds applied by a controller 122 when reading from a given block 128 of the memory 126. In one embodiment, the block-level read voltage thresholds are included in one of a number of operating parameter sets stored at the device 104. In another embodiment, the block-level read voltage thresholds are optimal block-level read voltage thresholds (e.g., representing read voltage thresholds programmatically determined to minimize errors when reading from a block 128).

At (4), the controller 122 determines, for each wordline-level set of optimal read voltage thresholds, differences between the optimal read voltage thresholds for the wordline and the read voltage thresholds that would otherwise be used to read from the wordline, as indicated within the block-level read voltage thresholds for the block 128 containing the wordline. For example, where a wordline is included within a block 128 assigned to operating parameter set 1 of FIG. 3, the controller 122 may determine that an optimal first read voltage threshold for a first wordline of the block 128 is 0.48 volts, and thus 0.01 volts lower than the read voltage thresholds indicated within operating parameter set 1. Similar offsets can be determined for each read voltage threshold of each wordline for which information has been gathered.

At (5), the controller 122 processes the determined offsets, as well as a location of a wordline corresponding to the determined offsets, to determine correlations between wordline location and offsets to read voltage thresholds. Illustratively, the controller 122 may generate an input layer for a neural network algorithm identifying a relative location of each wordline within a block 125 for which data has been collected, as well as the optimal read voltage thresholds for each wordline, and an output layer identifying offsets to read voltage thresholds for the wordline (e.g., differences between general read voltage thresholds for the block 128 and determined optimal read voltage thresholds for the wordline). The controller 122 can then implement a neural network algorithm with respect to the generated input and output layers, in order to determine one or more "hidden layers" between the input and output layer, which hidden layers represent correlations between values of the input layers and output layers. The hidden layers may be represented, for example, by an equation that utilizes the data points from an input layer and provides a likelihood of those data points result in a given value at the output layer (e.g., given read voltage threshold offsets). In one embodiment, the equation representing the hidden layers may be a weighted linear combination of one or more data points from the input layer (e.g., a wordline location within a block 128, one or more optimal read voltage thresholds for the wordline, etc.). As such, from a given input data (e.g., the location of a wordline within a block 128, the one or more optimal read voltage thresholds for the wordline, etc.), the equation indicates a strength of correlation to a given output layer value (e.g., read voltage offsets for the block).

At (6), the controller 122 utilizes the determined correlations to generate per-wordline read voltage offsets. In one embodiment, the controller 122 may generate per-wordline read voltage offsets by selecting a given output layer value with a highest correlation to the input layer (e.g., a most likely collection of read voltage threshold offsets). In another embodiment, the controller 122 may generate per-wordline read voltage offsets by combining one or more output layer values. For example, the controller 122 may determine a read voltage offset for a given read voltage threshold by a linear combination of potential read voltage offsets indicated within the output layer, weighted according to a probability that the input layer corresponds to the respected offsets. Illustratively, the controller 122 may determine that a wordline within a first location of a block 128 and having a given optimal value for a first read threshold is likely to have an offset for the first read threshold of n volts relative to general read voltage thresholds for the block 128. Thereafter, at (7), the controller 122 can store the determined wordline-level offsets in the configuration data store 124 for future use in reading from wordlines 204. Specifically, as shown in interaction (8), the controller 122 can apply the determined offsets when reading from wordlines 204 of the memory 126, to modify operating parameters that otherwise would be used to read from the wordlines 204. Because these offsets are expected to better reflect optimal read voltage thresholds for the wordlines 204, the accuracy of the controller 122 in reading information from the memory is expected to increase.

While embodiments are described above with respect to one grouping of memory cells—wordlines 204—embodiments of the present disclosure may be applied to determine correlations between characteristics of any grouping of memory cells and offsets to operating parameters that would otherwise be applied to the memory cells. Moreover, while a relative location within a block 128 and optimal read voltage thresholds are discussed above as examples of characteristics of a group of memory cells, other characteristics may additionally or alternatively be used. Such characteristics may include, for example, a failed bit count of the block 128, a programming for the block 128, an erase time for the block 128, or a number of programming loops needed to program the block 128. Similarly, while read voltage thresholds are discussed above as an example of operating parameters, the embodiments described herein may be used to correlate cell characteristics to any of a variety of operating parameters discussed herein. Thus, the interactions of FIG. 5 are intended to be illustrative in nature.

Figure 6:
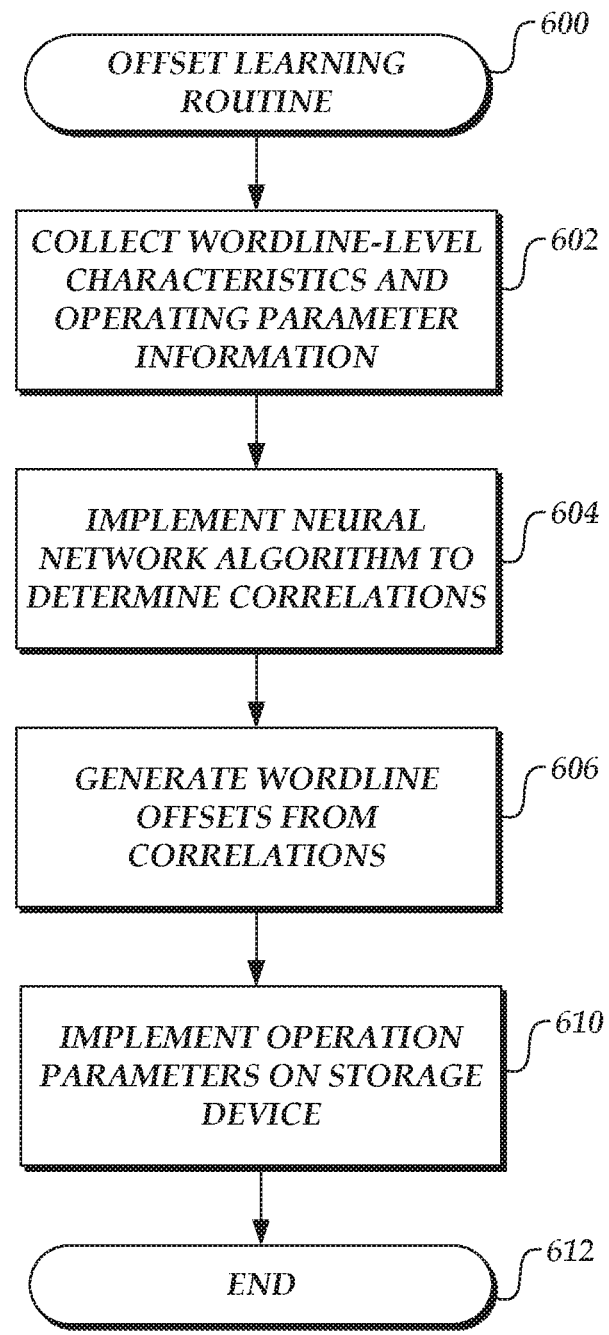
FIG. 6 is an illustrative routine for determining read threshold value offsets according to characteristics of a memory cell or group of memory cells by application of a machine learning algorithm to information regarding the memory cell or group of memory cells.

Implementing Parameter Offsets from Cell Characteristics
Routine for Correlating Wordline Characteristics to Parameter Offsets FIG. 6 depicts an illustrative routine 600 for correlating characteristics of one or more wordlines 204 with offsets to operating parameters for such cells, based on a neural network machine learning algorithm. The routine 600 may be implemented, for example, by a controller 122 within a data storage device 104 of FIG. 1.

The routine 600 begins at element 602, wherein the controller 122 receives information regarding characteristics of wordlines 204 within a data storage device 104, such as locations of the wordlines 204 relative to blocks 128 of the device, as well as operating parameter information for the wordlines 204, such as optimal read voltage thresholds for the wordlines 204 and read voltage thresholds for a block 128 including the respective wordlines 204. As discussed above, optimal read voltage thresholds for either or both the wordlines 204 or blocks 128 may be calculated in accordance with embodiments of the '340 Publication, incorporated by reference above.

Thereafter, at element 604, the controller 122 implements the neural network algorithm with respect to the collected characteristics and information, in order to determine correlations between characteristics of a wordline and offsets to the operating parameters of the wordline (e.g., representing differences between optimal operating parameters for the wordline and parameters for blocks including the wordline. General implementation of neural network algorithms is known in the art, and thus will not be discussed in detail herein. However, in brief, such implementation may include generating a data set from the collected characteristics and information, and processing the data set via the neural network to determine one or more "hidden layers" whose values indicate correlations between an input layer to the neural network algorithm (e.g., characteristics of the wordline, such as a location or optimal read voltage thresholds for the wordline) and an output layer to the neural network algorithm (e.g., offsets for operating parameters of the wordline).

At element 606, the controller 122 utilizes the determined correlations to generate per-wordline read voltage offsets. In one embodiment, the controller 122 may generate per-wordline read voltage offsets by selecting a given output layer value with a highest correlation to the input layer (e.g., a most likely collection of read voltage threshold offsets). In another embodiment, the controller 122 may generate per-wordline read voltage offsets by combining one or more output layer values. For example, the controller 122 may determine a read voltage offset for a given read voltage threshold by a linear combination of potential read voltage offsets indicated within the output layer, weighted according to a probability that the input layer corresponds to the respected offsets.

At element 608, the controller 122 implements the determined offsets when reading from or writing to wordlines 204 of a memory 126, to modify operating parameters that otherwise would be used to read from or write to the wordlines 204. For example, when the offsets indicate changes to read voltage parameters based on a relative location of a wordline within a block 128, the controller 122 may modify a general set of read voltage parameters for a block 128 by the amount of the offset, to account for an expected difference in optimal read voltage parameters for the wordline. Thus, by implementation of the routine 600, a controller 122 can increase the accuracy with which information stored in wordlines 204 of a memory 126.

Conclusion

As discussed above, the present disclosure enables efficient compaction of operating parameter sets on flash memory devices, by enabling similar operating parameter sets to be identified according to viewing the sets within a reduced dimensionality, and by enabling a new operating parameter set to be generated based on the similar operating parameters sets. This can enable a flash memory device to more accurately compact operating parameter sets, or to reduce the computing resources needed to compact operating parameter sets. In some instances, embodiments described herein can enable a device to compact operating parameter sets without required additional reads from or writes to a memory, thus reducing wear on the memory. Moreover, embodiments of the present disclosure overcome limitations inherent within devices that store a limited number of different operating parameter sets, by enabling offsets to be determined for specific memory cells of a device, at a granularity higher than what may be achieved using a limited number of operating parameter sets. These offsets can be applied when reading to or writing from memory cells corresponding to the offsets, to increase the accuracy of such reads and writes without substantially increasing the computing resources required during operation of a device. Thus, embodiments described herein can enable significant improvement in the operation of flash memory devices.

Other Variations

Those skilled in the art will appreciate that in some embodiments, additional or alternative modules can be used to perform functionalities described herein. The actual steps taken in the disclosed processes, such as the routines illustrated in FIGS. 4 and 6, may differ from those shown in the figures. Additional system components can be utilized, and disclosed system components can be combined or omitted. Depending on the embodiment, certain of the steps described above may be removed, others may be added.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to flash memory as included in any number of devices, such as removable flash cards, embedded memory, SSDs, hybrid hard drives, and the like. Moreover, while embodiments are described herein as implemented by a controller of a flash memory device, these functionalities may additionally or alternatively be implemented on systems external to a flash memory device. Illustratively, the machine learning algorithms described above with respect to FIGS. 5 and 6 may be implemented on a network-connected system external to a flash memory device, which operates to collect information from any number of devices and to determine correlations between characteristics of memory cells and offsets to operating parameters of such cells. Such system may then transmit learned correlation information or determined offsets to a flash memory device for use by a controller in the manner described above. One example of a network-connected system that may implement machine learning algorithms is provided within the '535 Publication, incorporated by reference above.

The various components illustrated in the figures may be implemented as software and/or firmware on a processor, ASIC/FPGA, or dedicated hardware. Hardware components, such as processors, ASICs, FPGAs, and the like, can have logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

While the description herein refers to flash or NAND memory, it is understood that the various disclosed embodiments are applicable to various types of non-volatile solid-state memory which may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete Non-Volatile Memory (NVM) chips, or any combination thereof.

What is claimed is:

1. A memory device comprising:
a non-volatile memory comprising data blocks, each data block including multiple wordlines, each wordline including at least one non-volatile solid-state memory cell;
a configuration data store storing a plurality read voltage threshold sets, each read voltage threshold set indicating at least a voltage threshold used to read NAND cells associated with the read voltage threshold set; and
a controller comprising a processor and configured to:
generate an input data layer for a neural network algorithm, the input data layer indicating, for each wordline of a plurality of wordlines within the non-volatile memory, a relative location of the wordline within a data block including the wordline;
generate an output data layer for the neural network algorithm, the output data layer including wordline-level offset data identifying, for each wordline of the plurality of wordlines, a read voltage offset for the wordline, the read voltage offset representing a difference between:
i) a voltage threshold indicated within a read voltage threshold set associated with a data block that includes the wordline; and
ii) a voltage threshold determined by the controller to minimize an error rate when reading data from the wordline; and
apply the neural network algorithm to the input data layer and the output data layer to determine correlation information correlating the relative locations of wordlines within data blocks and the read voltages offsets.

2. The memory device of claim 1, wherein the controller is further configured to:
receive a request to read data from a first wordline within a first data block of the non-volatile memory;
determine, from the correlation information, a read voltage offset for the first wordline;
apply the read voltage offset to a voltage threshold indicated within a read voltage threshold set associated with the first data block to result in a modified voltage threshold; and
read data from the first wordline according to the modified voltage threshold.

3. The memory device of claim 1, wherein the input data layer further indicates, for each wordline of the plurality of wordlines, the voltage threshold determined by the controller to minimize the error rate when reading data from the wordline.

4. The memory device of claim 1, wherein each read voltage threshold set indicates a plurality of voltage thresholds, each voltage threshold corresponding to a different potential state of a NAND memory cell.

5. The memory device of claim 4, wherein the wordline-level offset data identifies a plurality of read voltage offsets, each of the read voltage offsets corresponding to a voltage threshold of the plurality of voltage thresholds.

6. A method comprising:
obtaining data regarding a plurality of wordlines within one or more flash memory devices, each wordline corresponding to a grouping of memory cells in a non-volatile memory, the data comprising, for each wordline of the plurality of wordlines:
  a relative location of the wordline within a data block containing the wordline;
  a read voltage offset for the wordline, the read voltage offset representing a difference between i) a voltage threshold indicated within a read voltage threshold set associated with a data block that includes the wordline and ii) a voltage threshold determined to minimize an error rate when reading data from the wordline;
generating, from the data, an input data layer for a neural network algorithm, the input data layer indicating the relative locations within data blocks of respective wordlines within the plurality of wordlines;
generating, from the data, an output data layer indicating the read voltage offsets for respective wordlines in the plurality of wordlines; and
applying the neural network algorithm to the input data layer and the output data layer to determine correlation information correlating the relative locations of wordlines within data blocks and the read voltages offsets.

7. The method of claim 6, wherein the method is implemented by a flash memory device of the one or more flash memory devices.

8. The method of claim 6 further comprising:
receiving a request to read data from a first wordline within a first data block of the non-volatile memory;
determining, from the correlation information, a read voltage offset for the first wordline;
applying the read voltage offset to a voltage threshold indicated within a read voltage threshold set associated with the first data block to result in a modified voltage threshold; and
reading data from the first wordline according to the modified voltage threshold.

9. The method of claim 6, wherein each data block within the one or more flash memory devices includes wordlines in a plurality of relative locations, and wherein the method further comprises determining, from the correlation information, a read voltage offset for wordlines in each relative location of the plurality of relative locations.

10. The method of claim 6, wherein the non-volatile memory corresponds to at least one of single level cell (SLC) memory or multi-level cell (MLC) memory.

11. The method of claim 10, wherein the MLC memory corresponds to at least one of 2-bits per cell MLC or 3-bits per cell MLC.

12. The method of claim 6, wherein the input data layer further indicates, for each wordline of the plurality of wordlines, the voltage threshold determined to minimize the error rate when reading data from the wordline.

13. Non-transitory computer-readable media including computer-executable instructions that, when executed by a processor, cause the processor to:
obtain data regarding a plurality of wordlines within one or more flash memory devices, each wordline corresponding to a grouping of memory cells in a non-volatile memory, the data comprising, for each wordline of the plurality of wordlines:
  a relative location of the wordline within a data block containing the wordline; and
  a read voltage offset for the wordline, the read voltage offset representing a difference between i) a voltage threshold indicated within a read voltage threshold set associated with a data block that includes the wordline and ii) a voltage threshold determined to minimize an error rate when reading data from the wordline;
generate, from the data, an input data layer for a neural network algorithm, the input data layer indicating the relative locations within data blocks of respective wordlines within the plurality of wordlines;
generate, from the data, an output data layer indicating the read voltage offsets for respective wordlines in the plurality of wordlines; and
apply the neural network algorithm to the input data layer and the output data layer to determine correlation information correlating the relative locations of wordlines within data blocks and the read voltages offsets.

14. The non-transitory, computer-readable media of claim 13, wherein the computer-executable instructions further include instructions that cause the processor to obtain the data regarding the plurality of wordlines by writing to and reading from the plurality of wordlines.

15. The non-transitory, computer-readable media of claim 13, wherein the plurality of wordlines represents less than all wordlines within the one or more flash memory devices.

16. The non-transitory, computer-readable media of claim 13, wherein the computer-executable instructions further include instructions that cause the processor to:
receive a request to read data from a first wordline within a first data block of the non-volatile memory;
determine, from the correlation information, a read voltage offset for the first wordline;
apply the read voltage offset to a voltage threshold indicated within a read voltage threshold set associated with the first data block to result in a modified voltage threshold; and
read data from the first wordline according to the modified voltage threshold.

17. The non-transitory, computer-readable media of claim 13, wherein each data block within the one or more flash memory devices includes wordlines in a plurality of relative locations, and wherein the computer-executable instructions further include instructions that cause the processor to determine, from the correlation information, a read voltage offset for wordlines in each relative location of the plurality of relative locations.

18. The non-transitory, computer-readable media of claim 13, wherein the input data layer further indicates, for each wordline of the plurality of wordlines, the voltage threshold determined to minimize the error rate when reading data from the wordline.

19. A computing system comprising:
a data store including data regarding a plurality of wordlines within one or more flash memory devices, each wordline corresponding to a grouping of memory cells in a non-volatile memory, the data comprising, for each wordline of the plurality of wordlines:
  a relative location of the wordline within a data block containing the wordline; and
  a read voltage offset for the wordline, the read voltage offset representing a difference between i) a voltage threshold indicated within a read voltage threshold set associated with a data block that includes the wordline and ii) a voltage threshold determined to minimize an error rate when reading data from the wordline; and a processor configured with computer-executable instructions to:
  generate, from the data, an input data layer for a neural network algorithm, the input data layer indicating the relative locations within data blocks of respective wordlines within the plurality of wordlines;
  generate, from the data, an output data layer indicating the read voltage offsets for respective wordlines in the plurality of wordlines; and
  apply the neural network algorithm to the input data layer and the output data layer to determine correlation information correlating the relative locations of wordlines within data blocks and the read voltages offsets.

20. The computing system of claim 19, wherein the processor and data store are included within a flash memory device.

21. The computing system of claim 19, wherein the processor is further configured to:
  receive a request to read data from a first wordline within a first data block of the non-volatile memory;
  determine, from the correlation information, a read voltage offset for the first wordline;
  apply the read voltage offset to a voltage threshold indicated within a read voltage threshold set associated with the first data block to result in a modified voltage threshold; and
  read data from the first wordline according to the modified voltage threshold.

22. The computing system of claim 19, wherein each data block within the one or more flash memory devices includes wordlines in a plurality of relative locations, and wherein the processor is further configured to determine, from the correlation information, a read voltage offset for wordlines in each relative location of the plurality of relative locations.

* * * * *